United States Patent [19]

Hill et al.

[11] Patent Number: 4,858,819

[45] Date of Patent: Aug. 22, 1989

[54] ORTHOGONAL BONDING METHOD AND EQUIPMENT

[75] Inventors: William H. Hill; Dale W. Cawelti, both of Carlsbad, Calif.

[73] Assignee: Hughes Aircraft Company, Los Angeles, Calif.

[21] Appl. No.: 174,566

[22] Filed: Mar. 29, 1988

[51] Int. Cl.[4] .............................................. B23K 31/02
[52] U.S. Cl. ...................................... 228/179; 228/1.1
[58] Field of Search .................... 22/179, 180.1, 180.2, 22/1.1

[56] References Cited

U.S. PATENT DOCUMENTS

| | | | |
|---|---|---|---|
| 3,257,704 | 6/1966 | Hafner | 228/179 |
| 3,289,452 | 12/1966 | Kollner | 228/179 |
| 4,327,860 | 5/1982 | Kirshenboin et al. | 228/179 |
| 4,378,902 | 4/1983 | Fedak | 228/179 |
| 4,445,633 | 5/1984 | Bonham | 228/179 |
| 4,597,522 | 7/1986 | Kobayashi | 228/179 |
| 4,732,313 | 3/1988 | Kobayashi et al. | 228/179 |

Primary Examiner—M. Jordan
Attorney, Agent, or Firm—Joseph E. Szabo; Anthony W. Karambelas

[57] ABSTRACT

Wire bonds are closely spaced about the edge of a semiconductor chip device (150) in an orthogonal array. Even though the wires may have a fan out pattern to their second bond locations, close spacing of the first bond pads is achieved by use of rectangular pads (154) having their long dimensions all perpendicular to the chip edge, making all of the first bonds along lines perpendicular to the chip edge and then bending the wire to extend to the second bond.

4 Claims, 2 Drawing Sheets

ORTHOGONAL BONDING METHOD AND EQUIPMENT

BACKGROUND OF THE INVENTION

1. Field of the Invention

The present invention relates to electronic components and more particularly concerns arrangements of wire connections between bonding pads on an integrated circuit chip and another device.

2. Description of Related Art

Electronic components such as semiconductor devices often include an integrated circuit chip having a number of bonding pads mounted on the chip and extending along the chip edge. The chip is connected electrically to another component by electrically conductive wires that are bonded to the pads on the chip and often extend in a fan out pattern to second bonds on the device to which the chip is connected. When the wires extend in a fan out pattern from the chip, they inherently extend at an angle to the chip edge. The first bonds of the wire to the chip pads, which bands are in alignment with the wire, also extend at an angle to the chip edge. Therefore these first bonds must extend at an angle to or somewhat diagonally across the respective bond pads on the chip.

To accommodate a required minimum length of wire bond s on the bond pad that extends diagonally across the pad, the latter must have a relatively increased width. This increased width limits density of placement of adjacent bond pads on the chip, even though the highest density of bond pad placement is required for most components.

Accordingly, it is an object of the present invention to provide for increased density of bond pads on electronic components.

SUMMARY OF THE INVENTION

In carrying out principles of the present invention, in accordance with a preferred embodiment thereof, closely spaced rectangular bond pads are employed for first bond connections of the first end of a group of fan out connecting wires. The first bonds are made along lines perpendicular to the chip edge and, after the first bonds are completed, the tool is rotated to the selected angle with respect to the chip edge to complete its run to the second bond at the second end of the wire. The improved bonding method is carried out with a bonder that is controlled to orient the first bond along the long dimension of the relatively narrow rectangular bond pad and in a direction perpendicular to the edge of the chip. After lifting off the first bond the bonder head is rotated to the fan out angle, leading the wire toward the second bond pad and centering the bond tool foot on the wire.

DESCRIPTION OF THE PREFERRED EMBODIMENT

Figure 1:
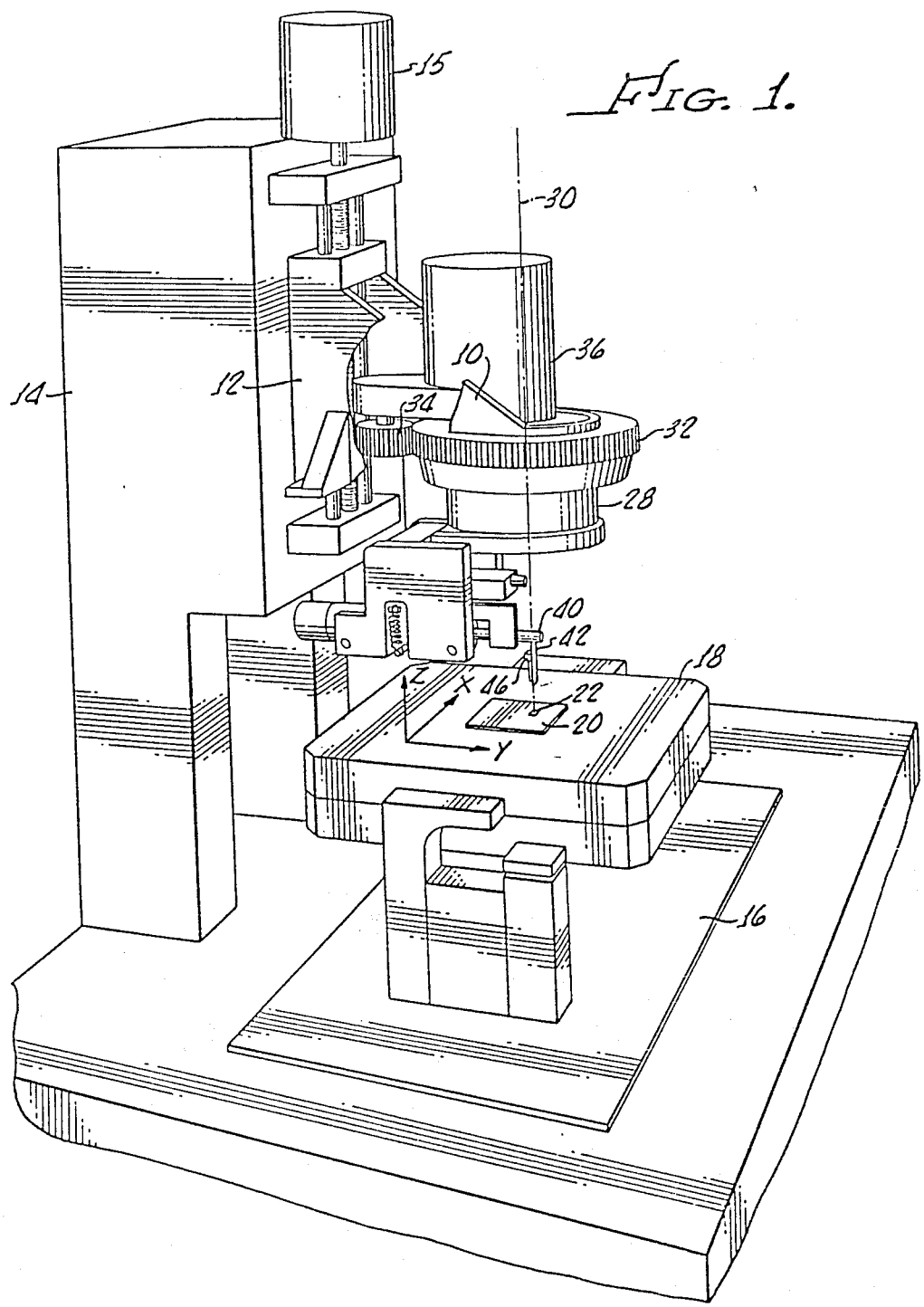
FIG. 1 is a simplified illustration of a bonder head that may be employed in the practice of the present invention.

An ultrasonic wire bonding machine which may be employed to carry out the method of the invention and to make electronic circuit components connected in accordance with principles of the present invention incorporates a bonding frame 10 fixedly carried on a vertically movable carriage or slide 12 that is mounted for vertical motion (along a Z axis) upon a support 14 under control of a vertical drive motor 15. Support 14 is fixed to a horizontal support structure 16 which carries a worktable 18 that is movable in controlled amounts in mutually orthogonal X and Y (horizontal) directions relative to the support 16 by conventional drive mechanisms (not shown).

The movable worktable 18 is adapted to fixedly carry a substrate 20, to which is mounted one or more electronic semiconductor or integrated circuit chip devices 22. Bonding frame 10 carries a bonder support structure 28 that is mounted to the frame 10 for rotation about a vertical axis 30 by means of a gear 32 fixedly carried by the support structure 28. The support structure and gear are selectively rotated by means of a driving gear 34 that is driven by a motor 36 fixedly carried by the vertical slide 12.

Support structure 28 resiliently mounts a bonding arm 40 to which is secured a generally vertically oriented bonding tool 42, having an axis coincident with rotation axis 30, and having a bonding tip 44 that is ultrasonically driven to effect a bond of a wire to its pad. Further details of this bonding machine are shown in my prior patents 4,598,853 for Open Center Flexural Pivot Wire Bonding Head and 4,600,138 for Bonding Tool and Clamp Assembly and Wire Handling Method. An electrically conductive wire to be bonded is carried by the bonding structure and extends downwardly along the bonding tool 42 to the tip 44 and extends under the tip 44 between the tip and the chip 22 to which the wire is to be bonded. A clamp, schematically shown at 46, is carried by the bonding structure to cooperate with the bonding tool to clamp the wire to the tool.

Figure 2:
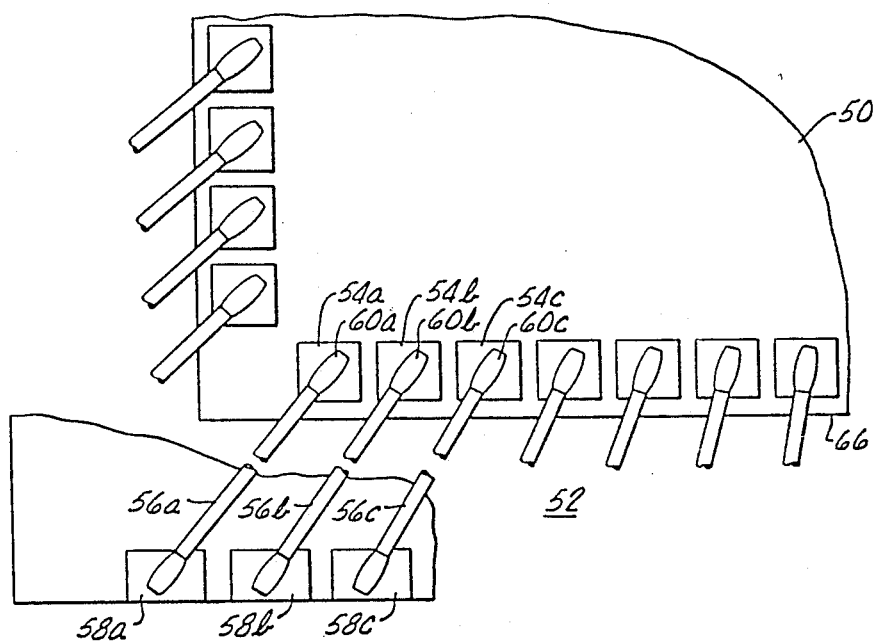
FIG. 2 is an illustration of the placement of a chip on a substrate and a group of fan out connecting wires connecting semiconductor chip pads to pads on the substrate as practiced in the prior art.

The described bonding tool is employed to electrically connect an electronic component, such as a semiconductor circuit chip, to another device or substrate to obtain an electrically connected device such as shown in the prior art drawing of FIG. 2. FIG. 2 shows a semiconductor chip 50, greatly enlarged, mounted on a substrate 52. The chip is shown as including a number of closely spaced electrically conductive bonding pads 54 a,b,c, etc. to which are connected wires 56a, 56b, 56c etc., having their ends remote from the semiconductor chip connected to substrate bonding pads 58a, 58b, 58c, etc.. Each wire is connected to its associated chip pad by a first bond 60a, 60b, 60c formed by the ultrasonic bonding tool.

In the procedure of the prior art for making the chip connections illustrated in FIG. 2, a length of wire is fed along the tool 42 with a first end positioned beneath the lower end of the tool tip 44, the wire end being bent under the tool tip, and the wire is clamped to the tool by clamp 46. The tool tip is positioned over the bond pad and rotated to orient the tool, and thus the small horizontal portion of the wire end beneath the tool tip, in the direction of a line extending from the bond pad 54a, for example, to the substrate bond pad 58a. The bonding tool is then lowered and energized to make the first bond 60a between the first end of the wire and the chip pad 54a. Effectively the wire end is flattened by the ultrasonic operation of the tool tip, which presses down upon the wire, and is thereby secured to the bond pad. Upon completion of the first bond, clamp 46 is released and the bonding head is raised to cause the tool tip to move along the wire and relative to the wire, of which the bonded end remains secured to the bond pad 54a.

When the bonding tool has been raised along the wire to a desired distance, it is moved together with the wire to a position above the substrate bond pad, such as pad 58, where the second bond is to be made. The tool is then lowered, and the second bond is completed. The wire is then pulled off the end of the second bond.

It will be seen that the wire of the prior art may extend in a straight line from one bonding pad to the other and is bonded to its pair of bonding pads by bonds which extend along lines that are aligned with each other and with the wire that extends between the bond pads. Where a group of wires on an electronic component extend in a fan out pattern from the chip, as shown, for example, in FIG. 2, or where the wire in general extends at an angle to the edge 66 of the semiconductor chip 50, the s ends of the wire which form the wire bonds 60a, 60b 60b and 60c extend somewhat diagonally across the bond pads 54a, 54b and 54c. In order to accommodate the diagonal extent of these bonds, the pads must have an increased width. For example, in a typical fan out pattern, according to the prior art, bond pads are square, having lengths and widths of 4 mils each side and are spaced from one another 5 mils on center. The relatively large 4 mil pad width is required by the diagonal position of the bond line.

According to the present invention, required width of the bond pad may be considerably decreased by orienting the first bond line perpendicular to the chip edge, regardless of the orientation of the wire run between the first and second bonds. This orientation of the first bond line perpendicular to the chip edge is maintained with a wire group extending in a fan out pattern simply by bending the wire after the first bond has been completed.

Figure 3:
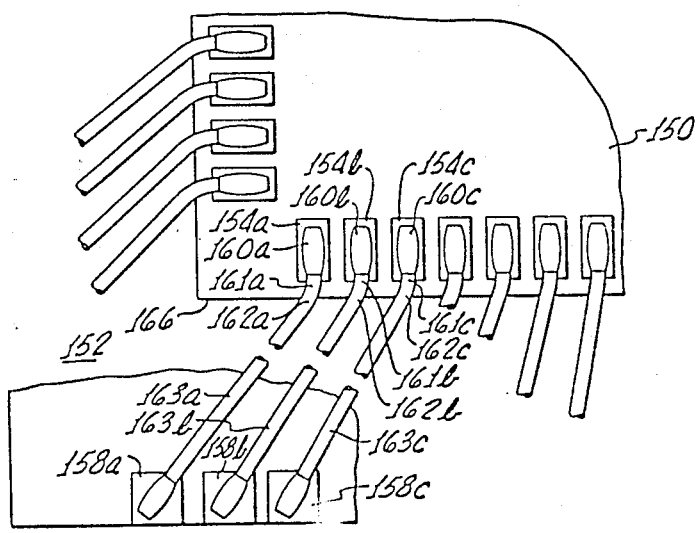
FIG. 3 illustrates a semiconductor chip on a substrate with narrow rectangular chip pads employed for connecting a plurality of orthogonal first bond fanned out wires.

A circuit chip assembly embodying principles of the present invention is illustrated in FIG. 3. The arrangement of FIG. 3 shows an assembly that is basically the same as that of the prior art of FIG. 2, but which has been adapted for use with narrow, rectangular bond pads more closely spaced to one another and employing interconnecting wires that are bent at or just beyond the first bonds thereof.

The component shown in FIG. 3 is basically similar to that shown in FIG. 2, but the actual configuration of chip pads and configuration of wires interconnecting chip pads with substrate pads are significantly different. In the arrangement of FIG. 3 chip 150 is mounted upon a substrate 152 and has a plurality of narrow rectangular chip pads 154a, 154b, 154c etc. positioned on the chip in densely packed configuration extending around at least portions of the chip periphery. Each rectangular pad 154 has a long dimension and a short dimension, with the long dimension of each being positioned perpendicular to the chip edge 166, and the long dimensions of all pads being parallel to one another. Whereas the chip pads 54 of the prior art arrangement of FIG. 2 typically are 4 mils×4 mils square and positioned at 5 mils on center, the chip pads of FIG. 3 have dimensions of 2 mils×4 mils and are positioned at 3 mils on center. The considerably decreased width of chip pads of FIG. 3, and therefore the much smaller (3 mil) center to center spacing thereof, is made possible by the orientation of the first wire bonds 160a, 160b, 160c etc. on the chip pads. These wire bonds are all oriented, as illustrated in the drawing, along a line perpendicular to the chip edge 166.

All first bonds of the pads are parallel to one another and all are perpendicular to the chip edge. Thus the wire bonds do not extend diagonally across the chip pads, but extend along and in alignment with the long dimension of these rectangular and long, narrow pads. Straight wire sections 161a, 161b and 161c etc., which may be merely end portions of the first bonds, extend to a bend point 162a, 162b, 162c etc.. These bend points may be at the first bond ends or spaced from such ends by a small distance, preferably vertical. From the bends, the wires then extend in relatively straight loops 163a, 163b, , 163c, etc. to the second bond pads 158a, 158b, 158c, etc. secured to the substrate 152. Note that in all cases the substrate pads 158 are generally larger since these are not constrained by the very small configuration of the chip itself.

With the chip pad and bent wire configuration and first wire bond orientation shown in FIG. 3 the chip pads may be more densely located so that a larger number of connections may be more readily made to the semiconductor chip 150.

It will be apparent that a number of different procedures of manipulation and operation of the bonding tool may be followed in order to obtain the configuration of elements shown in FIG. 3. Typically a bonding procedure which will provide the results shown in FIG. 3 provides for horizontal motion of the worktable in X and Y to position the tool tip directly above a first bond pad, such as pad 154a. A wire is fed to and beneath the tool tip and clamped in place by clamp 46. The bond head is then rotated about axis 30 to ensure that the wire end under the tool tip is extending in a direction perpendicular to the chip edge 166. Now, with the tool head rotationally positioned so that the wire end is oriented perpendicular to the chip edge and is above and aligned with the longitudinal center line of the long narrow rectangular pad 154, the tool is lowered toward the pad. The wire is caused to be pressed against the pad while the tool is energized with ultrasonic energy, and the first bond is made. Because of the selected orientation of the tool head, the first bond extends along a line perpendicular to the chip edge, as previously described. The clamp is released and the tool is raised to allow it to slide along the wire to a desired position. Now the tool is rotated to align the tool tip along a line directed toward the remote substrate bond pad 158a. The table is traversed in X,Y, moving the tool and wire, relative to the table, in the proper direction, to cause the tool tip to be positioned over the substrate pad. Then the tool with the wire and its tool tip descend to perform the second bond. After the second bond is completed the tool is moved up, over and down relative to the table to form a new length of wire under the tool tip. Then the clamp is closed and travel of the movable worktable in the fan out direction pulls the wire off at the outer end of second bond. The wire bent under the tool tip and held in place by the closed clamp is now ready for the next wire first bond. Thus the completely bonded wire forms a somewhat vertical loop between its bonded ends, the loop extending upwardly from the first bond and downwardly toward the second bond, with the loop having a bend close to the first bond. The bend effects a change in the horizontal direction of the loop adjacent the first bond.

The bonding tool and the worktable are conventionally controlled, driving the bonding tool through its rotation (about Z axis 30) and vertical motion (in the Z direction) and driving the worktable in its X,Y positioning either under manual control in the sequence described or, as is preferred, under control of a programmed computer.

Although the described orientation of the long dimension of rectangular chip pads as perpendicular to the chip edge is preferred, it will be appreciated that increased pad density may also be achieved by use of closely spaced rectangular pads having their long dimensions extending at an angle other than 90° to the chip edge, provided that the axes or long dimensions of the adjacent pads are all parallel to one another.

What is claimed is:

1. A method of electrically connecting areas of a semiconductor ship to a plurality of outer bond points, said method comprising the steps of:

provilding a plurality of closely adjacent elongated bond pads on said ship along an edge of the chip with relatively longer dimensions of said pads oriented substantially parallel to one another, orienting a first end of a wire to be bonded in a first direction relative to the chip edge, bonding said wire end to a pad on the chip along a bond line extending in said first direction, bending the wire adjacent the chip edge to extend in a second direction, extending the wire in said second direction to an outer bond point displaced from said chip, and bonding a portion of said wire to said outer bond point.

2. A method of bonding a conductor to a semiconductor chip by employing an elongate bonding tool having means for guiding a wire toward a lowermost end thereof and means on such lowermost end for orienting a where to be bonded, said tool having means for clamping the wire thereto and being mounted for rotation about an axis extending through the tool, said method comprising the steps of:

forming a plurality of rectangular bond pads on said chip adjacent an edge of said chip in closely spaced side-by-side relation, with longer dimensions of said rectangular bond pads being parallel to one another and at angle to said chip edge, positioning the tool adjacent an edge of the chip and over an area of the chip at which a first bond is to be made, feeding a first end of a wire to the lowermost end of said tool, rotating the tool to orient the wire end at the lowermost end thereof in a direction extending substantially parallel to the surface of the semiconductor chip and substantially at said angle to said chip edge, lowering the tool toward the chip surface, bonding the wire first end to one of said pads and along a bond line that extends along one of said rectangular pads in a direction substantially parallel to the longer dimension thereof, raising the tool and rotating it about said axis to align the tool in the direction of a line extending to a second area at which a second bond is to be made, moving the tool and the wire in said direction to said second area, and bonding the wire to said second point.

3. The method of claim 2 wherein said step of forming serves to create bond pads that are substantially perpendicular to said chip edge and wherein said step of rotating serves to orient the wire end in a direction extending substantially perpendicular to said chip edge.

4. The method of claim 2 wherein said step of bonding the wire first end to one of said pads comprises bonding said wire first end along a bond line that extends substantially along the center of one of said rectangular pads.

* * * * *